United States Patent [19]

Liu et al.

[11] Patent Number: 5,536,705
[45] Date of Patent: Jul. 16, 1996

[54] SUPERCONDUCTOR WITH 1212 PHASE OF HG,PB,SR,BA,CA,Y,CU OXIDE

[75] Inventors: Ru-shi Liu; Der-Shiuh Shy; Chung-Ho Tai, all of Hsinchu; Hui-Wen Lee, Chang Hau, all of Taiwan

[73] Assignee: Industrial Technology Research Institute, Hsinchu, Taiwan

[21] Appl. No.: 489,086

[22] Filed: Jul. 31, 1995

[51] Int. Cl.$^6$ ............... H01B 12/00; C04B 35/057; C04B 35/45; C04B 35/505
[52] U.S. Cl. ............ 505/125; 505/500; 505/730; 505/742; 505/779; 505/780; 501/123; 501/126; 252/521
[58] Field of Search ............ 505/780, 125, 505/500, 730, 742, 779; 501/123, 126; 252/521

[56] References Cited

U.S. PATENT DOCUMENTS 5,300,482  4/1994  Doi et al. ............ 505/783 X

FOREIGN PATENT DOCUMENTS

94/02947  2/1994  WIPO .

OTHER PUBLICATIONS

Liu, R. S., et al., "Crystal structure and superconductivity in the Hg–containing Ba— and Sr–based cuprates", *Physica C*, 235–240 (Part II) (Dec. 1994), 897–8.
Liu, R. S., et al., "Crystal structure of the (Pb,Hg)Sr$_2$(Ca, Y)Cu$_2$O$_{7-\delta}$ superconductor", *Physica C*, 222(1&2) (10 Mar. 1994), 13–18.
Rao, C. N. R., et al., "Structural aspects of superconducting cuprates", *Acta Crystallographica, Section B (Structural Science)*, vol. B51, pt. 4 (1 Aug. 1995), 604–618.
Liu, R. S., et al., "New Hg–containing high–Tc superconductors", *Chin. J. Phys. (Taipei)*, 31 (6, pt. 2) (1993), 1121–6.

S. N. Putilin, et al., "New Complex Copper Oxides:HgBa$_2$RCu$_2$O$_7$," *Mat. Res. Bull.*, vol. 26, 1991, 1299–1307.

R. S. Liu et al., "A new 92K high–Tc Superconductor Hg–containing Tl–based 1212 phase", *Physica C205*, 1993, 206–211.

A. Schilling, et al., "Superconductivity above 130K in the Hg–Ba–Ca–Cu–O system", *Letters to Nature/May* 1993, 56–58.

Hu, S. F., et al., "Superconductivity up to 90K in a New Family," *Journal of Solid State Chemistry*, 103, 280–286 (1993).

Hahakura, S., et al., "New Barium–free mercury–based high–Tc superconductors", *Physica C*, 233 (1994), 1–7.

*Primary Examiner*—Douglas J. McGinty
*Attorney, Agent, or Firm*—W. Wayne Liauh

[57] ABSTRACT

A family of mercury-containing Sr-(Ca•Y)-Cu-O superconducting materials having a zero-resistance temperature, $T_{c(zero)}$, greater than 90 K so that they can be cooled to and maintain the desired superconducting characteristics using relatively less expensive liquid nitrogen, are disclosed. The high-temperature superconductor is represented by the formula of: $(Pb_{0.5}Hg_{0.5})(Sr_{2-x}Ba_x)(Ca_{0.7}Y_{0.3})Cu_2O_{7-\delta}$; wherein the value of x ranges between about 0.1 and about 0.6, preferably between about 0.2 and about 0.3. These superconducting materials are prepared by first grinding and mixing in open air constituent oxide powders of PbO, HgO, SrO$_2$, BaO$_2$, CaO, Y$_2$O$_3$, and CuO. After mixing, the powder mixture is pressed under a pressure of about 5 ton/cm$^2$ to form a pellet having a diameter of 8 mm and a thickness of 3 mm. Thereafter, the pressed pellet is wrapped with a gold foil (with a thickness of 0.05 mm), and sealed inside a quartz tube under vacuum (~$10^{-4}$ Torr). The quartz tube containing the pellet was then placed inside a high temperature oven and sintered at 970° C. for 24 hours.

6 Claims, 5 Drawing Sheets

5,536,705

SUPERCONDUCTOR WITH 1212 PHASE OF HG,PB,SR,BA,CA,Y,CU OXIDE

FIELD OF THE INVENTION

The present invention relates to mercury-containing copper oxides as superconducting materials. More specifically the present invention relates to a mercury-containing Sr-(Ca•Y)-Cu-O superconductors with a zero resistance temperature above 90 K. and with high stability in open air, and method of making the same.

BACKGROUND OF THE INVENTION

Putilin, et al in 1991 successfully synthesized and studied a family of complex mercury-containing copper oxides, $HgBa_2RCu_2O_7$(R=La, Nd, Eu, Gd, Dy, Y). See Putilin, et al: "New Complex Copper Oxides: $HgBa_2RCu_2O_7$(R=La, Nd, Eu, Gd, Dy, Y)," Mat. Res. Bull. Vol. 26, pp. 1299–1307 (1991). This family of oxides were considered as first examples of Hg-containing complex copper oxides with intergrowth structures ("1212" structural type. However, it was reported that magnetic measurements performed on these compounds down to 12 K. did not show noticeable diamagnetic effects. No other superconducting characteristic was observed with this family of compounds.

In 1992, R. S. Liu, one of the co-inventors of the present invention, discovered, along his coworkers, that bulk superconductivity of up to 92 K. can be achieved in the mercury-containing cuprate, $(Tl_{0.5}Hg_{0.5})Sr_2(Ca_{1-x}Y_x)Cu_2O_{7-\delta}$. See R. S. Liu, S. F. Hu, D. A. Jefferson, P. P. Edwards, and P. D. Hunnyball: "A New 92 K. High-$T_c$ Superconductor," PHYSICA C, vol. 205, pp. 206–211 (1993). It is to be noted that the bulk superconductivity of up to 92 K. was measured and reported based on the temperature of onset diamagnetism. The zero-resistance temperature, $T_{c(zero)}$, of the mercury-containing cuprate synthesized by Liu et al was substantially lower, at 76 K.

Essentially concurrently with the discovery of Liu et al discussed above, S. F. Hu, D. A. Jefferson, R. S. Liu (a co-inventor of the present invention), and P. P. Edwards in an article entitled: "Superconductivity up to 90 K. in a New Family of the (Pb, Hg)$Sr_2$(Ca, Y)$Cu_2O_7$ System," Journal of the Solid State Chemistry, vol. 103 pp. 280–286 (1993), disclosed a family of superconductors in the $(Pb_{0.5}Hg_{0.5})Sr_2(Ca_{1-x}Y_x)Cu_2O_{7-\delta}$ system for the composition range of $0.5 \geq x \leq 0.2$, with a maximum $T_c$ of 90 K. However, the 90 K. "$T_c$" reported in the Hu article was referring to the "midpoint" superconducting temperature; its zero-resistance temperature, $T_{c(zero)}$, was also substantially lower, at 77 K.

In an article entitled: "Superconductivity Above 130 K. in the Hg-Ba-Ca-Cu-O System," by A Schilling, M. Cantoni, J. D. Guo, and H. R. Ott, Nature, vol. 363, pp 56–58, it was disclosed a superconducting material containing $HgBa_2Ca_2Cu_3O_{1+x}$ (with three $CuO_2$ layers per unit cell), $HgBa_2CaCu_2O_{6+x}$ (with two $CuO_2$ layers per unit cell), and an ordered superstructure comprising a defined sequence of the unit cells of these phases. In that article, Schilling and the co-authors reported magnetic and resistivity measurements conducted on these materials confirmed a maximum transition temperature of about 133 K. However, the Hg-Ba-Ca-Cu-O superconducting system disclosed by Schilling et al involves a very complicated synthesis procedure, which would lead to low purity of the final product and difficulties in attempts to produce commercial quantities. Furthermore, the Hg-Ba-Ca-Cu-O material can be easily hydrolyzed when exposed to the atmosphere. This weakness could greatly undermine its practical usefulness.

Comparing the Hg-containing Sr-based phases of $(Tl_{0.5}Hg_{0.5})Sr_2(Ca_{1-x}Y_x)Cu_2O_{7-\delta}$ and $(Pb_{0.5}Hg_{0.5})Sr_2(Ca_{1-x}Y_x)Cu_2O_{7-\delta}$ with the Hg-containing Ba-based Hg-Ba-Ca-Cu-O phase, the former can be prepared from its constituent metal oxides in air; whereas, the later must be prepared in a strictly controlled condition, which typically involves a moisture-free glove box. Furthermore, after synthesis, the Hg-containing Sr-based phases of $(Tl_{0.5}Hg_{0.5})Sr_2(Ca_{1-x}Y_x)Cu_2O_{7-\delta}$ and $(Pb_{0.5}Hg_{0.5})Sr_2(Ca_{1-x}Y_x)Cu_2O_{7-\delta}$ are also more stable than the Hg-containing Ba-based Hg-Ba-Ca-Cu-O phase, and can be stored in ambient or open air. Therefore, the Hg-containing Sr-based superconductor material has better potential for practical applications, and can be more easily manufactured in large production quantities than the Hg-containing Ba-based type superconductor material.

In 1994, Hahakura, S., Shimoyama, J., Shiino, O., and Kishio, K., disclosed in an article entitled: "New Barium-Free Mercury-Based High-$T_c$ Superconductors (Hg, Mo)$Sr_2$(Ca, Y)$_{n-1}Cu_nO_y$ and $HgSr_2$(Ca, Y)$_{n-1}$(Cu, Re)$_nO_y$ (n=1 and 2)," a Ba-free Hg based superconductor having good stability under open air. However, the zero resistance temperature $T_{c(zero)}$ was measured to be only at 58 K., substantially higher than all the superconductor discussed above.

SUMMARY OF THE INVENTION

The primary object of the present invention is to develop a superconducting material which has a zero-resistance temperature $T_{c(zero)}$ greater than 90 K. so that it can be cooled to and maintained at the desired superconducting condition using relatively less expensive liquid nitrogen. More specifically, the primary object of the present invention is to develop a mercury-containing Sr-based [Sr-(Ca•Y)-Cu-O] super-conducting material with a zero resistance temperature $T_{c(zero)}$ above 90 K. so that it can be cooled to and maintained at the desired superconducting condition using liquid nitrogen. The mercury-containing Sr-based superconducting material disclosed in the present invention can be represented by the formula of $(Pb_{0.5}Hg_{0.5})(Sr_{2-x}Ba_x)(Ca_{0.7}Y_{0.3})Cu_2O_{7-\delta}$. Preferably, the value of x is between about 0.2 and about 0.3. When x is within this preferred range, a zero resistance temperature $T_{c(zero)}$ above 90 K. can be obtained, and the synthesized product exhibited a very high purity, essentially of a pure phase.

In addition to their high zero resistance temperature, the mercury-containing Sr-(Ca•Y)-Cu-O superconducting materials disclosed in the present invention also offer several advantages. For example, because their synthesis involves a much less complicated process, they can be more easily manufactured in large commercial quantities. Furthermore, mercury-containing Sr-(Ca•Y)-Cu-O superconducting materials disclosed in the present invention are highly stable in air. Thus a large variety of practical applications can be obtained. This is a very significant advantage over the $(Pb_{0.5}Hg_{0.5})Sr_2(Ca_{1-x}Y_x)Cu_2O_{7-\delta}$ compounds.

The mercury-containing Sr-(Ca•Y)-Cu-O superconductors disclosed in the present invention can be prepared by first grinding and mixing in open air the constituent raw metal oxide powders of PbO, HgO, $SrO_2$, $BaO_2$, CaO, $Y_2O_3$, and CuO according to the formula of $(Pb_{0.5}Hg_{0.5})(Sr_{2-x}Ba_x)(Ca_{0.7}Y_{0.3})Cu_2O_{7-\delta}$, wherein x=0.1~0.6. After mixing, the powder mixture can be pressed under a pressure of about 5 ton/cm$^2$ to form a pellet having a diameter of 8 mm and a thickness of 3 mm. The powder mixture can also be formed into any other desired shape. Thereafter, the pellet can be wrapped with a gold foil (with a thickness of 0.05 mm), and sealed inside a quartz tube under vacuum (~10$^{-4}$ Torr). The quartz tube containing the pellet can be placed inside a high temperature oven and heated at rate of 600° C./hr until 970° C., then sintered at 970° C. for 24 hours. After sintering, the oven temperature is decreased at a rate of 300° C./hr to room temperature.

As discussed above, a zero resistance temperature of 92 K. can be obtained with the mercury-containing Sr-(Ca•Y)-Cu-O superconductor disclosed in the present invention, and the final product also exhibits very high purity. Because a relatively simple process can be utilized to synthesize the mercury-containing Sr-(Ca•Y)-Cu-O superconductor of the present invention, commercial production can be more easily implemented. Also, the mercury-containing Sr-(Ca•Y)-Cu-O superconducting materials of the present invention exhibits very high stability in open air. This greatly enhances the number of potential applications that can be obtained using the present invention.

BRIEF DESCRIPTION OF THE DRAWING

The present invention will be described in detail with reference to the drawings showing the preferred embodiment of the present invention, wherein.

DETAILED DESCRIPTION OF THE PREFERRED EMBODIMENT

Figure 1:
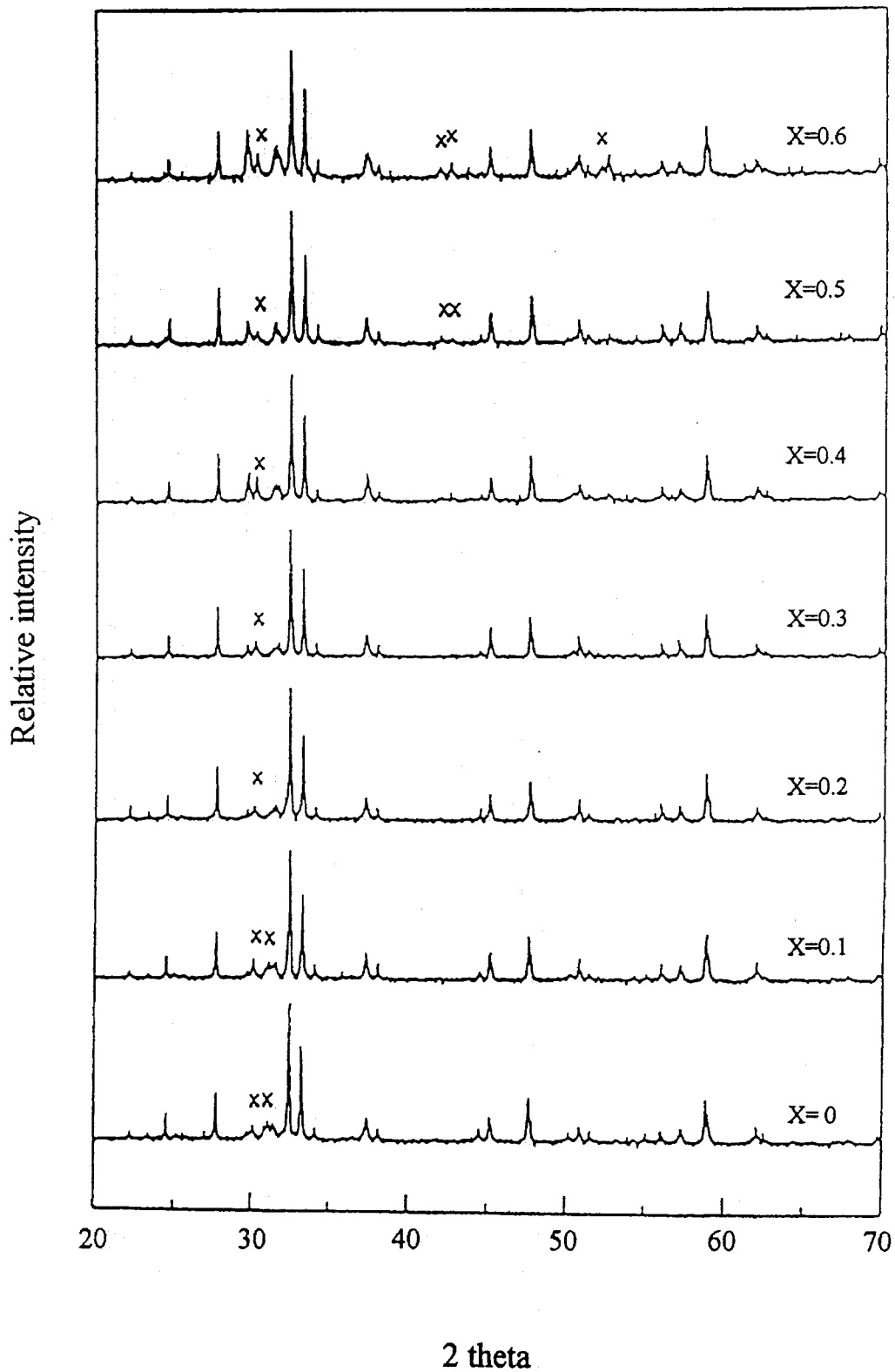
FIG. 1 shows X-ray diffraction plots of $(Pb_{0.5}Hg_{0.5})(Sr_{2-x}Ba_x)(Ca_{0.7}Y_{0.3})Cu_2O_{7-\delta}$ sample powders of the present invention (x from 0 to 0.6); the lower case "x" in the drawings indicates impurities.

The present invention discloses a family of mercury-containing Sr-(Ca•Y)-Cu-O superconducting materials having a zero-resistance temperature, $T_{c(zero)}$, greater than 90 K. so that they can be cooled to and maintain the desired superconducting characteristics using relatively less expensive liquid nitrogen. The mercury-containing Sr-(Ca•Y)-Cu-O superconducting material disclosed in the present invention is represented by the formula of $(Pb_{0.5}Hg_{0.5})(Sr_{2-x}Ba_x)(Ca_{0.7}Y_{0.3})Cu_2O_{7-\delta}$; and the preferred values of x range between about 0.2 and about 0.3. When the value of x is provided within this preferred range, a zero resistance temperature $T_{c(zero)}$ of above 90 K. can be obtained, and the synthesized products are essentially of a pure phase. In addition to their high zero resistance temperature, the mercury-containing Sr-(Ca•Y)-Cu-O super-conducting materials of the present invention also offered several advantages. On of the advantages is that, because these materials can be synthesized with a much less complicated process, they stand for a much better potential for commercial scale production.

In a preferred embodiment of the present invention, the mercury-containing Sr-(Ca•Y)-Cu-O superconductors of the present invention were prepared by first grinding and mixing in open air constituent oxide powders of PbO, HgO, SrO$_2$, BaO$_2$, CaO, Y$_2$O$_3$, and CuO according to the formula of $(Pb_{0.5}Hg_{0.5})(Sr_{2-x}Ba_x)(Ca_{0.7}Y_{0.3})Cu_2O_{7-\delta}$, wherein x ranged between approximately 0.1 and approximately 0.6 to form a powder mixture. After mixing, the powder mixture was pressed under a pressure of about 5 ton/cm$^2$ to form a pellet having a diameter of 8 mm and a thickness of 3 mm. The powder mixture can also be formed into any other desired shapes. Thereafter, the pressed pellet was wrapped with a gold foil (with a thickness of 0.05 mm), and sealed inside a quartz tube under vacuum (~10$^{-4}$ Torr). The quartz tube containing the pellet was then placed inside a high temperature oven and heated at rate of 600° C./hr to 970° C., then maintained at 970° C. for 24 hours. After sintering, the oven temperature was decreased at a rate of 300° C./hr to room temperature.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

Preparation of Raw Powder Mixture

A raw powder mixture containing 0.3507 g of PbO, 0.3404 g of HgO, 0.7143 g of SrO$_2$, 0.05322 g of BaO$_2$, 0.0529 g of CaO, 0.2484 g of Y$_2$O$_3$, and 0.5 g of CuO was prepared and mixed in open air. The powder mixture represented a chemical formula of $(Pb_{0.5}Hg_{0.5})(Sr_{2-x}Ba_x)(Ca_{0.7}Y_{0.3})Cu_2O_{7-\delta}$, wherein x=0.1.

Pelletilization and Tube-sealing

The powder mixture prepared above was pressed under a pressure of 5 ton/cm$^2$ to form a pellet having a diameter of 8 mm and a thickness of 3 mm. The pellet was wrapped with a gold foil (the thickness of the gold foil was 0.05 mm), and the gold-wrapped pellet was sealed inside a quartz tube under a vacuum of about 10$^{-4}$ Torr.

Sintering

The pellet sealed inside the quartz tube was placed inside high temperature furnace. Initially the temperature of the furnace was increased at a rate of about 600° C. until a temperature of 970° C. was reached, at which time, the furnace was maintained at 970° C. for 24 hours. After the sintering stage, the furnace temperature was decreased at a rate of 300° C. per hour to room temperature. A black $(Pb_{0.5}Hg_{0.5})(Sr_{1.9}Ba_{0.1})(Ca_{0.7}Y_{0.3})Cu_2O_{7-\delta}$ sample was obtained.

X-ray Diffraction Study

The black $(Pb_{0.5}Hg_{0.5})(Sr_{1.9}Ba_{0.1})(Ca_{0.7}Y_{0.3})Cu_2O_{7-\delta}$ pellet obtained above was studied using X-ray diffraction. The results are shown in FIG. 1 (x=0.1). The X-ray diffraction results show that the $(Pb_{0.5}Hg_{0.5})(Sr_{1.9}Ba_{0.1})(Ca_{0.7}Y_{0.3})Cu_2O_{7-\delta}$ pellet exhibited very high purity, and was essentially of a pure phase. After a structural refinement, based on a tetragonal crystalline structure and P4/mmm symmetry, the c-axis and a-axis crystal lattice constants for the $(Pb_{0.5}Hg_{0.5})(Sr_{1.9}Ba_{0.1})(Ca_{0.7}Y_{0.3})Cu_2O_{7-\delta}$ pellet were obtained. The results are summarized in FIGS. 2 and 3, respectively.

Measurement of Electric Resistance as a Function of Temperature

The electric resistance of the $(Pb_{0.5}Hg_{0.5})(Sr_{1.9}Ba_{0.1})(Ca_{0.7}Y_{0.3})Cu_2O_{7-\delta}$ pellet obtained above was measured as a function of temperature. The result, which is summarized in FIG. 4, indicates that the $(Pb_{0.5}Hg_{0.5})(Sr_{1.9}Ba_{0.1})(Ca_{0.7}Y_{0.3})Cu_2O_{7-\delta}$ pellet has a zero resistance temperature close to 90 K.

EXAMPLE 2

The preparation and testing procedures in Example 2 were identical to those described in Example 1, except that the powder mixture contained 0.3507 g of PbO, 0.3404 g of HgO, 0.6767 g of $SrO_2$, 0.1064 g of $BaO_2$, 0.0529 g of CaO, 0.2484 g of $Y_2O_3$, and 0.5 g of CuO. The powder mixture represented a chemical formula of $(Pb_{0.5}Hg_{0.5})(Sr_{2-x}Ba_x)(Ca_{0.7}Y_{0.3})Cu_2O_{7-\delta}$, wherein x=0.2. The X-ray diffraction results for the $(Pb_{0.5}Hg_{0.5})(Sr_{1.8}Ba_{0.2})(Ca_{0.7}Y_{0.3})Cu_2O_{7-\delta}$ pellet were summarized in FIGS. 1-3, and the resistance-temperature plot was shown in FIG. 4. FIG. 4, indicates that the $(Pb_{0.5}Hg_{0.5})(Sr_{1.8}Ba_{0.2})(Ca_{0.7}Y_{0.3})Cu_2O_{7-\delta}$ pellet has a zero resistance temperature of about 92 K.

EXAMPLE 3

The preparation and testing procedures in Example 3 were identical to those described in Example 1, except that the powder mixture contained 0.3507 g of PbO, 0.3404 g of HgO, 0.6391 g of $SrO_2$, 0.1600 g of $BaO_2$, 0.0529 g of CaO, 0.2484 g of $Y_2O_3$, and 0.5 g of CuO. The powder mixture represented a chemical formula of $(Pb_{0.5}Hg_{0.5})(Sr_{2-x}Ba_x)(Ca_{0.7}Y_{0.3})Cu_2O_{7-\delta}$, wherein x=0.3. The X-ray diffraction results for the $(Pb_{0.5}Hg_{0.5})(Sr_{1.7}Ba_{0.3})(Ca_{0.7}Y_{0.3})Cu_2O_{7-\delta}$ pellet are summarized in FIGS. 1-3, and the resistance-temperature plot was shown in FIG. 4. FIG. 4, indicates that the $(Pb_{0.5}Hg_{0.5})(Sr_{1.7}Ba_{0.3}(Ca_{0.7}Y_{0.3})Cu_2O_{7-\delta}$ pellet has a zero resistance temperature of about 92 K.

EXAMPLE 4

The preparation and testing procedures in Example 4 were identical to those described in Example 1, except that the powder mixture contained 0.3507 g of PbO, 0.3404 g of HgO, 0.6015 g of $SrO_2$, 0.2129 g of $BaO_2$, 0.0529 g of CaO, 0.2484 g of $Y_2O_3$, and 0.5 g of CuO. The powder mixture represented a chemical formula of $(Pb_{0.5}Hg_{0.5})(Sr_{2-x}Ba_x)(Ca_{0.7}Y_{0.3})Cu_2O_{7-\delta}$, wherein x=0.4. The X-ray diffraction results for the $(Pb_{0.5}Hg_{0.5})(Sr_{1.6}Ba_{0.4})(Ca_{0.7}Y_{0.3})Cu_2O_{7-\delta}$ pellet are summarized in FIGS. 1-3, and the resistance-temperature plot was shown in FIG. 4.

EXAMPLE 5

The preparation and testing procedures in Example 5 were identical to those described in Example 1, except that the powder mixture contained 0.3507 g of PbO, 0.3404 g of HgO, 0.5639 g of $SrO_2$, 0.2661 g of $BaO_2$, 0.0529 g of CaO, 0.2484 g of $Y_2O_3$, and 0.5 g of CuO. The powder mixture represented a chemical formula of $(Pb_{0.5}Hg_{0.5})(Sr_{2-x}Ba_x)(Ca_{0.7}Y_{0.3})Cu_2O_{7-\delta}$, wherein x=0.5. The X-ray diffraction results for the $(Pb_{0.5}Hg_{0.5})(Sr_{1.5}Ba_{0.5})(Ca_{0.7}Y_{0.3})Cu_2O_{7-\delta}$ pellet are summarized in FIGS. 1-3, and the resistance-temperature plot was shown in FIG. 4.

EXAMPLE 6

The preparation and testing procedures in Example 6 were identical to those described in Example 1, except that the powder mixture contained 0.3507 g of PbO, 0.3404 g of HgO, 0.5263 g of $SrO_2$, 0.3193 g of $BaO_2$, 0.0529 g of CaO, 0.2484 g of $Y_2O_3$, and 0.5 g of CuO. The powder mixture represented a chemical formula of $(Pb_{0.5}Hg_{0.5})(Sr_{2-x}Ba_x)(Ca_{0.7}Y_{0.3})Cu_2O_{7-\delta}$, wherein x=0.6. The X-ray diffraction results for the $(Pb_{0.5}Hg_{0.5})(Sr_{1.4}Ba_{0.6})(Ca_{0.7}Y_{0.3})Cu_2O_{7-\delta}$ pellet are summarized in FIGS. 1-3, and the resistance-temperature plot was shown in FIG. 4.

COMPARATIVE EXAMPLE

The preparation and testing procedures in the Comparative Example were identical to those described in Example 1, except that the powder mixture contained 0.3507 g of PbO, 0.3404 g of HgO, 0.7519 g of $SrO_2$, 0.0529 g of CaO, 0.2484 g of $Y_2O_3$, 0.5 g of CuO, and no $BaO_2$. The powder mixture represented a chemical formula of $(Pb_{0.5}Hg_{0.5})(Sr_{2-x}Ba_x)(Ca_{0.7}Y_{0.3})Cu_2O_{7-\delta}$, wherein x=0. The X-ray diffraction results for the $(Pb_{0.5}Hg_{0.5})(Sr_2)(Ca_{0.7}Y_{0.3})Cu_2O_{7-\delta}$ pellet are summarized in FIGS. 1-3, and the resistance-temperature plot was shown in FIG. 4.

In summary, FIG. 1, which shows X-ray diffraction plots of $(Pb_{0.5}Hg_{0.5})(Sr_{2-x}Ba_x)(Ca_{0.7}Y_{0.3})Cu_2O_{7-\delta}$ sample powders of the present invention, indicates that when x is between 0 and 0.3, the compound is nearly pure $(Pb_{0.5}Hg_{0.5})(Sr, Ba)_2(Ca, Y)Cu_2O_{7-\delta}$ (1212) phase. When the value of x exceeds 0.3, then the extent of impurity increased.

Figure 2:
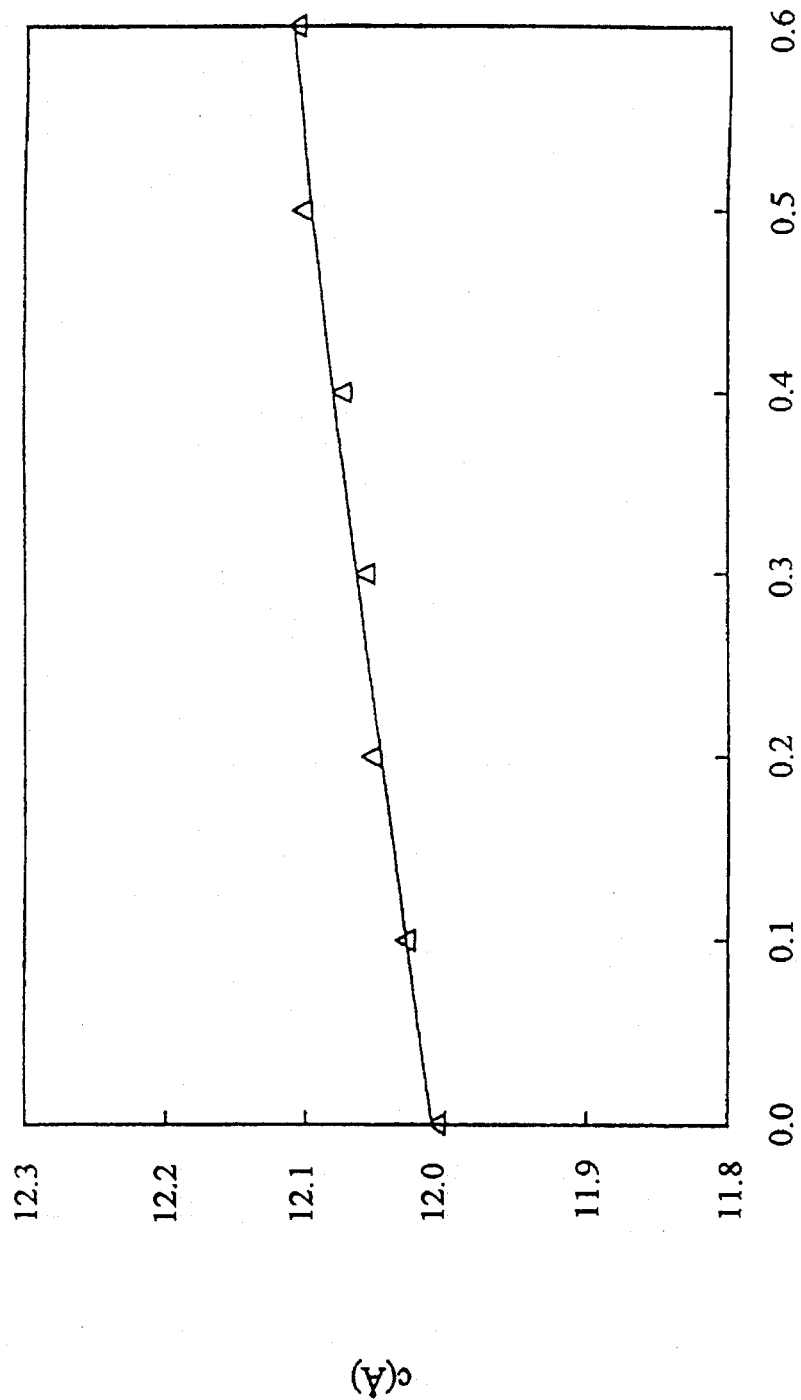
FIG. 2 shows plots of c-axis crystal lattice constants versus the values of x, from 0 to 0.6, measured from the $(Pb_{0.5}Hg_{0.5})(Sr_{2-x}Ba_x)(Ca_{0.7}Y_{0.3})Cu_2O_{7-\delta}$ sample powders of the present invention.

FIG. 2, which shows plots of c-axis crystal lattice constants versus the values of x, from 0 to 0.6, measured from the $(Pb_{0.5}Hg_{0.5})(Sr_{2-x}Ba_x)(Ca_{0.7}Y_{0.3})Cu_2O_{7-\delta}$ sample powders, indicates that when x=0, the c-axis crystal lattice constant was 12.0077 Å. But when x=0.6, the c-axis crystal lattice constant became 12.1096 Å, representing a 0.85% increase in the c-axis crystal lattice. It is believed that this increase was caused by the fact that, as the value of x increased, the smaller $Sr^{2+}$ ions were substituted by the larger $Ba^{2+}$ ions. With a coordination number of 9, the radius of the $Sr^{2+}$ ion is 1.31 Å. On comparison, with the same coordination number of 9, the radius of the $Ba^{2+}$ ion is 1.47 Å. This confirmed the hypothesis by the co-inventors of the present invention before undertaking the effort leading to this discovery that the $Ba^{2+}$ ions, though are larger in size, can replace the $Sr^{2+}$ ions in the $(Pb_{0.5}Hg_{0.5})(Sr_{2-x}Ba_x)(Ca_{0.7}Y_{0.3})Cu_2O_{7-\delta}$ compounds.

Figure 3:
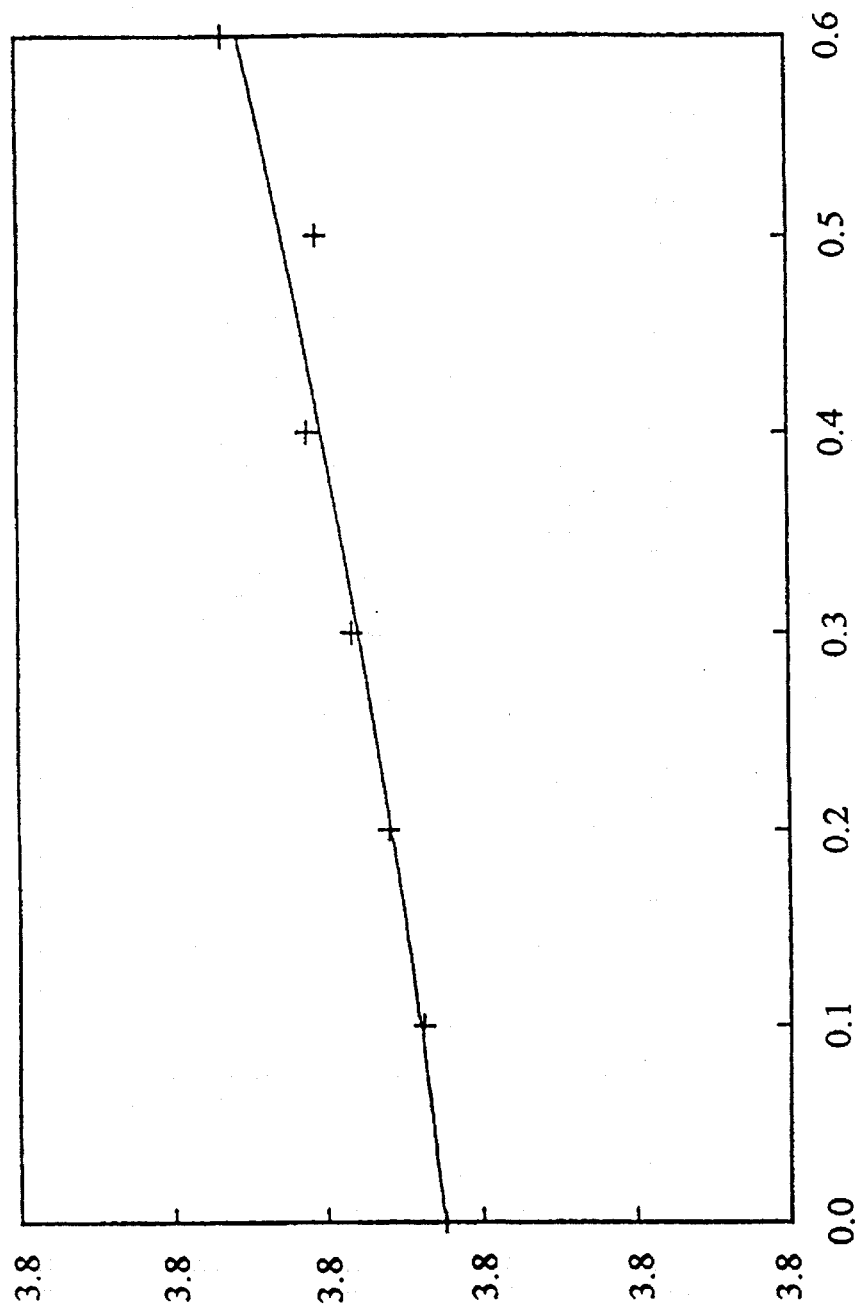
FIG. 3 shows plots of a-axis crystal lattice constants versus the value of x, from 0 to 0.6, measured from the $(Pb_{0.5}Hg_{0.5})(Sr_{2-x}Ba_x)(Ca_{0.7}Y_{0.3})Cu_2O_{7-\delta}$ sample powders of the present invention.
Figure 4:
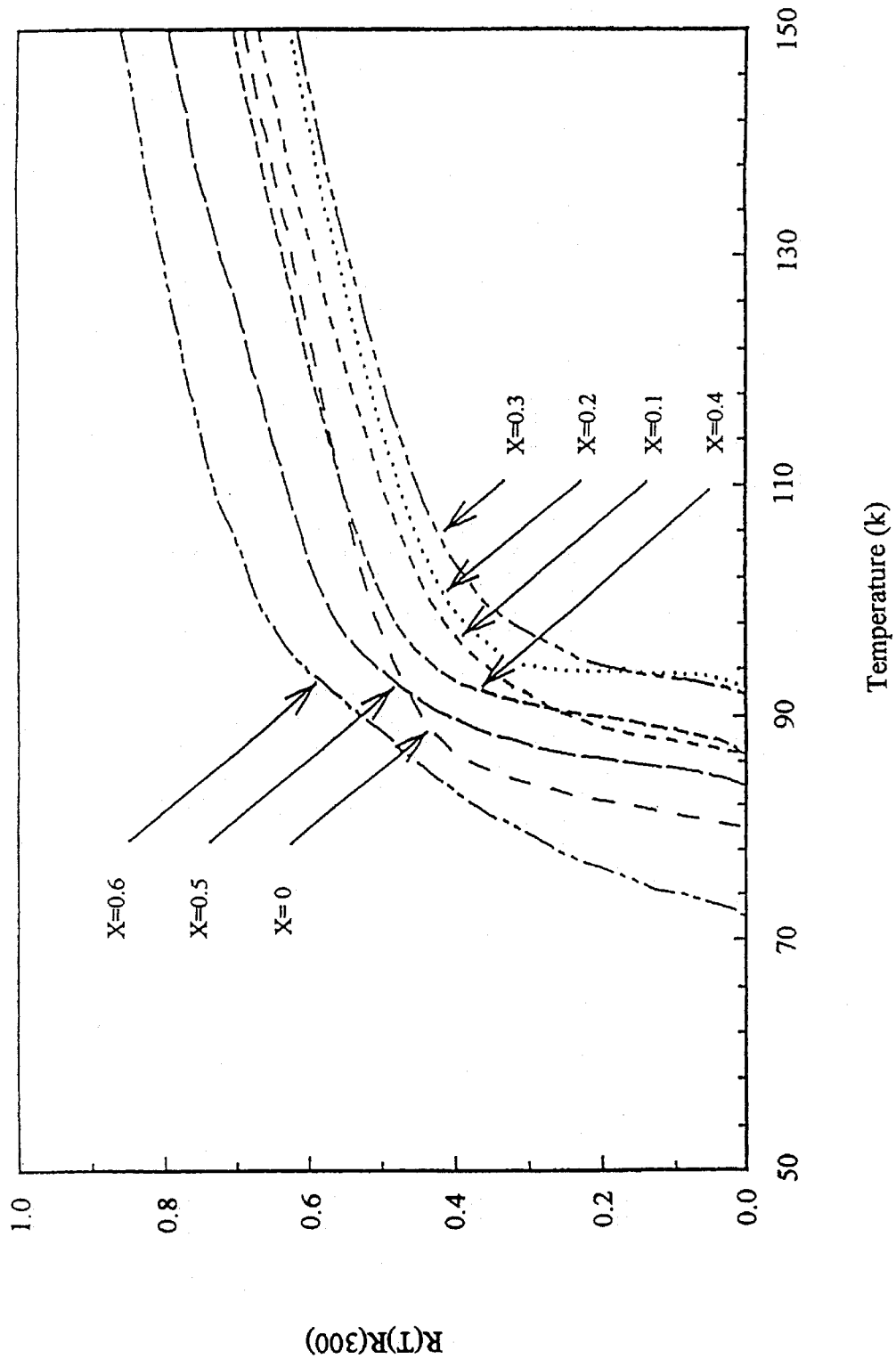
FIG. 4 shows plots of electrical resistances versus temperature for the $(Pb_{0.5}Hg_{0.5})(Sr_{2-x}Ba_x)(Ca_{0.7}Y_{0.3})Cu_2O_{7-\delta}$ sample powders of the present invention, with x ranging from 0 to 0.6.

FIG. 3, which shows plots of a-axis crystal lattice constants measured from the $(Pb_{0.5}Hg_{0.5})(Sr_{2-x}Ba_x)(Ca_{0.7}Y_{0.3})Cu_2O_{7-\delta}$ sample powders of the present invention, indicates that the a-axis crystal lattice constant increased from 3.8124 Å at x=0 to 3.8266 Å at x=0.6, representing an increase of 0.37% in the a-axis crystal lattice with x. The reason for this increase in the a-axis crystal lattice with increasing x is similar to the increase in the c-axis crystal lattice, both are because the larger $Ba^{2+}$ ions are replacing the smaller $Sr^{2+}$ ions in the $(Pb_{0.5}Hg_{0.5})$ $(Sr_{2-x}Ba_x)(Ca_{0.7}Y_{0.3})Cu_2O_{7-\delta}$ compounds, as the value of x increases.

Figure 5:
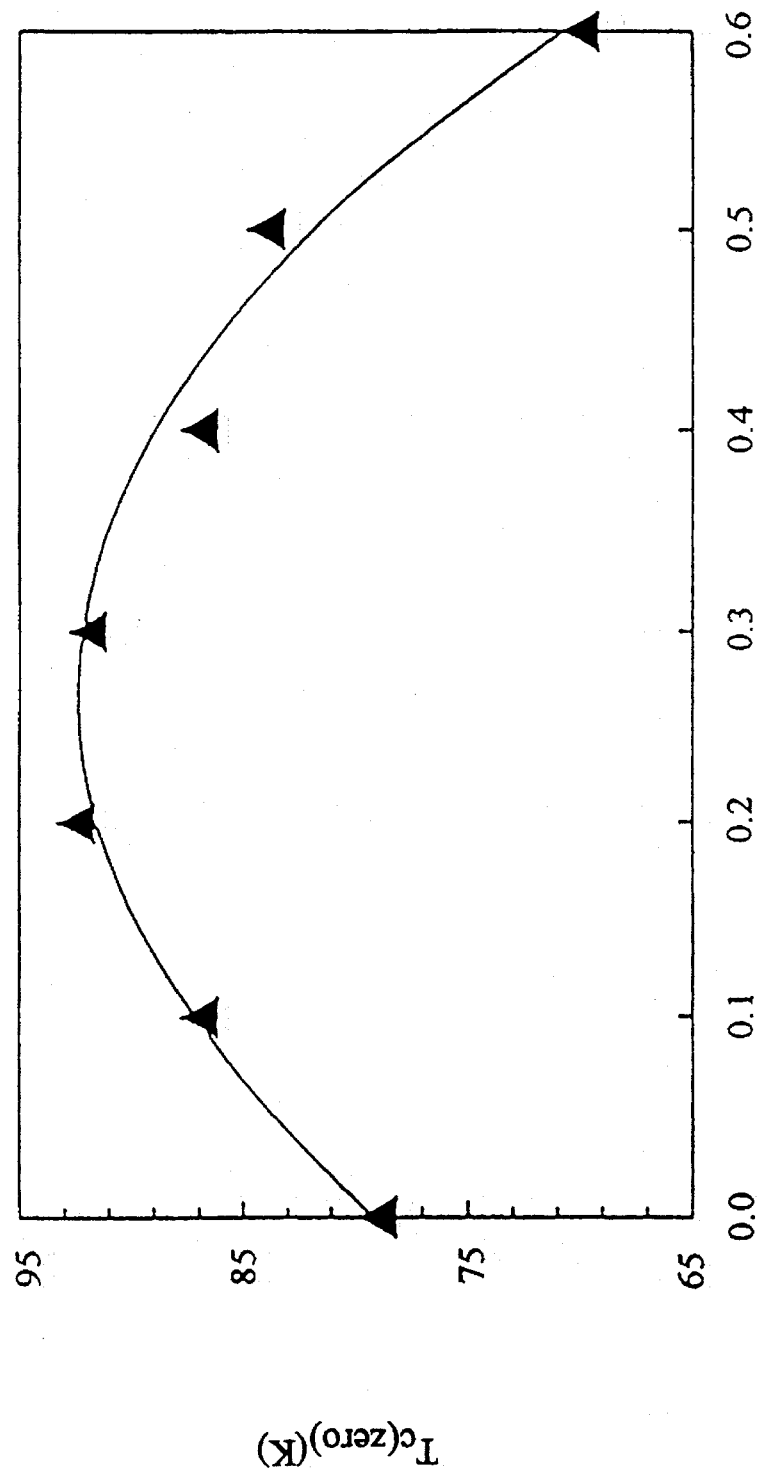
FIG. 5 is a plot of the measured zero resistance temperature, $T_{c(zero)}$, as a function of the value x for the $(Pb_{0.5}Hg_{0.5})(Sr_{2-x}Ba_x)(Ca_{0.7}Y_{0.3})Cu_2O_{7-\delta}$ sample powders of the present invention, with the values of x ranging from 0 to 0.6.

FIG. 4 shows plots of electrical resistances versus temperature for the $(Pb_{0.5}Hg_{0.5})(Sr_{2-x}Ba_x)$ $(Ca_{0.7}Y_{0.3})Cu_2O_{7-\delta}$ sample powders of the present invention. FIG. 5 is a plot of the measured zero resistance temperature, $T_{c(zero)}$, as a function of the value x for the $(Pb_{0.5}Hg_{0.5})(Sr_{2-x}Ba_x)(Ca_{0.7}Y_{0.3})Cu_2O_{7-\delta}$ sample powders. FIGS. 4 and 5 indicate that at x=0, the measured $T_{c(zero)}$ was 79 K. As $Ba^{2+}$ ions were added to replace the $Sr^{2+}$ ions (i.e., when x became non-zero), the measured $T_{c(zero)}$ increased, to a maximum of 92.5 K. at x=0.2, then gradually decreased when x became greater than 0.2. It was speculated that the existence of the optimum x value was related to the fact that, initially at x=0, the hole concentration in the $CuO_2$ superconducting planes of the $(Pb_{0.5}Hg_{0.5})(Sr_{2-x}Ba_x)(Ca_{0.7}Y_{0.3})Cu_2O_{7-\delta}$ compound was "over-doped". As the $Ba^{2+}$ ions were added, the hole concentration in the $CuO_2$ planes was decreased. This is evidenced by the fact that as the value of x increased, the a-axis crystal lattice also increased (i.e., the bond length of Cu-O increased), thus resulting in a decrease in the relative hole concentration in the $CuO_2$ planes. This contributed to the increase in the $T_{c(zero)}$ to 92.5 K. when x is at about 0.2. When the value of x was greater than 0.2, however, it appeared that the hole concentration in the $CuO_2$ planes was reduced to below the optimum condition, i.e., it became "under-doped". This could explain the decrease in the measured $T_{c(zero)}$, when x exceeded 0.2. However, by adding the $Ba^{+2}$ ions into the $(Pb_{0.5}Hg_{0.5})(Sr_2)(Ca_{0.7}Y_{0.3})Cu_2O_{7-\delta}$ and increasing the value of x from 0 to 0.2, the present invention was able to raise the zero resistance temperature from 79 K. to 92.5 K., such that the superconducting condition can be maintained with relatively inexpensive liquid nitrogen. Thus the present invention greatly enhances the practical applications of the mercury-containing Sr-(Ca•Y)-Cu-O superconducting materials.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A high-temperature superconductor represented by the formula of:

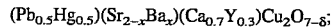
$(Pb_{0.5}Hg_{0.5})(Sr_{2-x}Ba_x)(Ca_{0.7}Y_{0.3})Cu_2O_{7-\delta}$;

wherein the value of x ranges between about 0.1 and about 0.5.

2. A high-temperature superconductor according to claim 1 wherein the value of said x ranges between about 0.2 and about 0.3.

3. A high-temperature superconductor according to claim 2 which has a zero resistance temperature above 90 K.

4. A high-temperature superconductor according to claim 2 which has a zero resistance temperature of about 92 K. or higher.

5. A high-temperature superconductor according to claim 1 which is prepared by first mixing a powder mixture containing PbO, HgO, $SrO_2$, $BaO_2$, CaO, $Y_2O_3$, and CuO in open air, then sintering said powder mixture.

6. A high-temperature superconductor according to claim 5 wherein said superconductor is prepared by sintering said powder mixture according the following steps:

(a) sealing said powder mixture in an inert tube under vacuum; and (b) sintering said powder mixture at temperatures between 900° and 1,000° C. for between 1 and 24 hours.

* * * * *